US006674104B2

United States Patent
Phillips

(10) Patent No.: US 6,674,104 B2
(45) Date of Patent: Jan. 6, 2004

(54) BIPOLAR TRANSISTOR

(75) Inventor: Timothy J Phillips, Malvern (GB)

(73) Assignee: QinetiQ Limited, Farnborough (GB)

( * ) Notice: Subject to any disclaimer, the term of this patent is extended or adjusted under 35 U.S.C. 154(b) by 0 days.

(21) Appl. No.: 10/275,558

(22) PCT Filed: May 24, 2001

(86) PCT No.: PCT/GB01/02284
§ 371 (c)(1),
(2), (4) Date: Nov. 7, 2002

(87) PCT Pub. No.: WO01/93337
PCT Pub. Date: Dec. 6, 2001

(65) Prior Publication Data
US 2003/0183845 A1 Oct. 2, 2003

(30) Foreign Application Priority Data
May 30, 2000 (GB) .............................................. 0012925

(51) Int. Cl.[7] .......................................... H01L 31/0328
(52) U.S. Cl. ...................... 257/197; 257/198; 257/565; 257/592; 257/615
(58) Field of Search ............................... 257/197, 198, 257/565, 592, 615

(56) References Cited

U.S. PATENT DOCUMENTS

| 4,395,722 A |   | 7/1983 | Esaki et al. |
| 5,216,271 A | * | 6/1993 | Takagi et al. ............... 257/197 |
| 5,382,814 A |   | 1/1995 | Ashley et al. |

FOREIGN PATENT DOCUMENTS

| GB | 2 266 183   | 10/1993 |
| WO | WO 97/20353 | 6/1997  |

OTHER PUBLICATIONS

Patent Abstracts of Japan, vol. 015, No. 265, Jul. 5, 1991 and JP 03 088369, Apr. 12, 1991.

* cited by examiner

Primary Examiner—Mark V. Prenty
(74) Attorney, Agent, or Firm—Nixon & Vanderhye P.C.

(57) ABSTRACT

A bipolar transistor having base and collector regions of narrow bandgap semiconductor material and a minority-carrier excluding base contact has a base doping level greater than $10^{17}$ cm$^{-3}$. The transistor has a greater dynamic range, greater AC voltage and power gain-bandwidth products and a lower base access resistance than prior art narrow band-gap bipolar transistors.

5 Claims, 7 Drawing Sheets

BIPOLAR TRANSISTOR

This application is the U.S. national phase of international application PCT/GB01/02284 filed May 24, 2001 which designated the U.S.

The invention relates to bipolar transistors of the kind which implement exclusion and extraction of minority carriers from the base.

Narrow band gap semiconductors such as indium antimonide (lnSb) are characterised by high electron mobility, high electron saturation velocity and low electron effective mass. These properties are of great interest for high speed device applications, for example high speed transistors. Bipolar transistors fabricated from narrow band gap semiconductors may be operated at high frequencies, and consume less power than conventional transistors because they may be operated with low collector and base voltages.

However, at room temperature, a narrow band-gap semiconductor has a high intrinsic carrier concentration (i.e. electron-hole pairs provided by thermal excitation as opposed to single carrier type produced by ionising a donor or acceptor). Consequently a bipolar transistor fabricated from such semiconductors suffers from high leakage current and high output conductance. This results in low dynamic range and limited voltage gain.

Low dynamic range in a narrow band gap bipolar transistor may be counteracted by use of excluding and extracting contacts at the transistor's base region, as disclosed in U.S. Pat. No. 5 382 814. This patent discloses an lnSb bipolar transistor with a base region that is intrinsic at room temperature, due to the fact that the background doping level (number of ionised dopant atoms) is lower than the intrinsic carrier concentration. Under operation, minority carriers are extracted from the transistors base at the junctions with the emitter and collector regions. Minority carriers are excluded from entry into the base from the transistors base contact by a wide band gap $ln_{0.85}Al_{0.15}Sb$ region between the base contact and the base. The carrier concentration in the base is therefore reduced well below the intrinsic carrier concentration, reducing leakage current and increasing dynamic range somewhat. However, the dynamic range and high frequency performance of this bipolar transistor are still relatively poor, and the devices are found not to work properly at temperatures approaching ambient temperature, which is necessary for any practical device. The bipolar transistor disclosed in the above patent has a further disadvantage in that it has a high base access resistance because the base region is of low doping, which results in poor power gain.

It is an object of the invention to provide an alternative form of bipolar transistor.

The present invention provides a bipolar transistor having emitter and collector regions arranged to extract minority carriers from the base region, a structure for counteracting entry of minority carriers into the base region via the base contact, the base region and the collector region having a band gap less than 0.5 eV and wherein the base region has a doping level greater than $10^{17}$ cm$^{-3}$.

The invention provides the advantages that a transistor of the invention has a greater dynamic range, greater AC voltage and power gain-bandwidth products and a lower base access resistance than prior art narrow-bandgap bipolar transistors.

Transistors of the invention preferably have an emitter region with a larger band gap than that of the base region. This ensures that transistors of the invention provide useful current gain when the doping level of the base is large compared with that of the emitter.

The structure for counteracting entry of minority carriers into the base via the base contact may be an excluding heterostructure, with a barrier to prevent carriers entering the base. Alternatively it may be an implanted region within the base region, providing a "high-low" doping junction which also inhibits minority carrier entry into the base. This alternative provides for simpler fabrication and allows the use of the wide gap emitter as a passivation layer between the base and emitter regions, if desired. The inclusion of a passivation layer improves performance by reducing recombination in the base. This is known to cause increased leakage and reduced current gain in prior art bipolar transistors, so the reduction of this is beneficial.

In order that the invention may be more fully understood, embodiments thereof will now be described, by way of example only, with reference to the accompanying drawings in which.

Areas of diagonal shading within FIGS. 1 to 9 indicate regions of semiconductor material with a higher band gap than is the case for unshaded regions.

Figure 1:
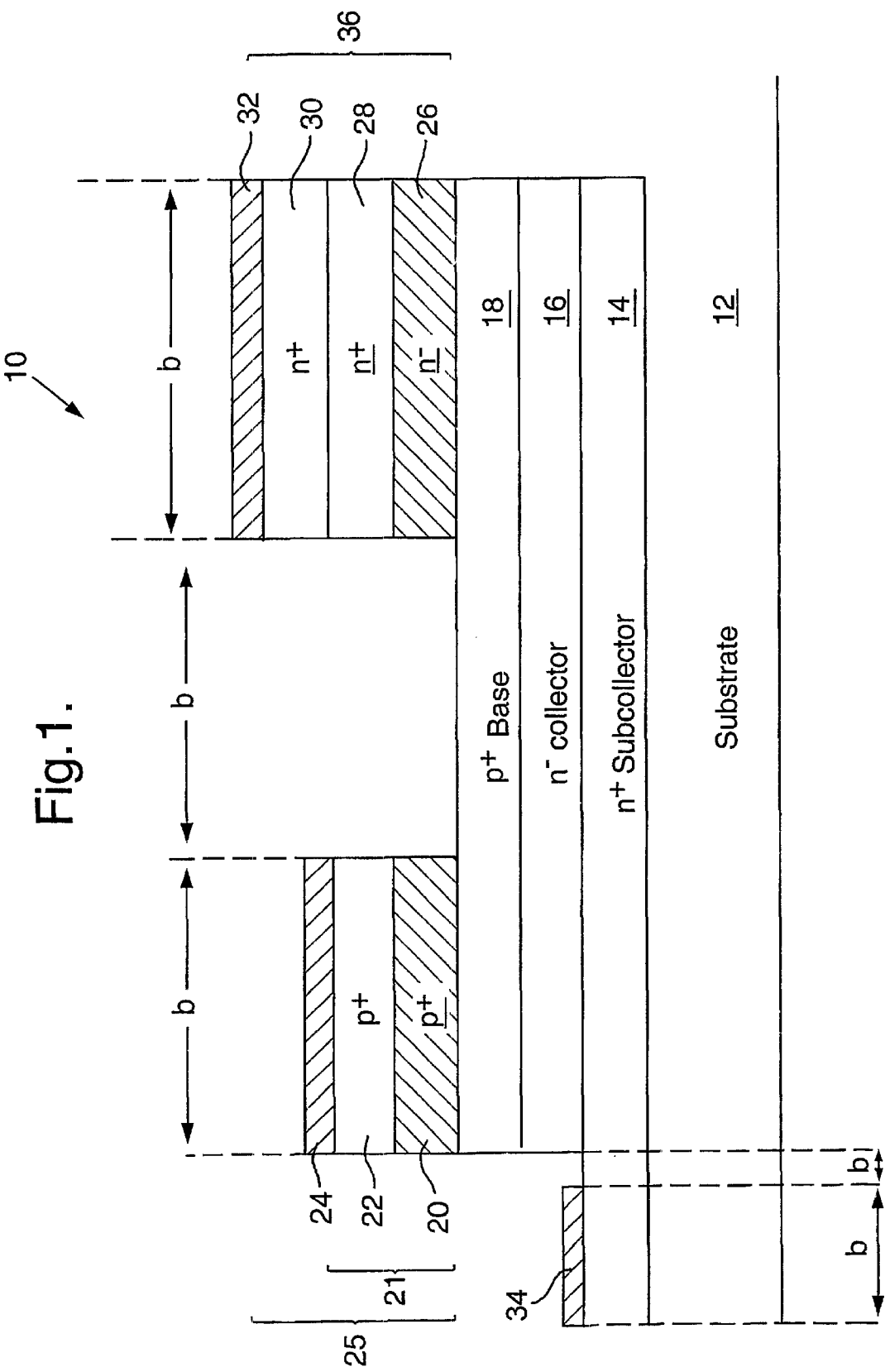
FIG. 1 shows a vertical cross-section through a transistor of the invention.

Referring to FIG. 1, there is shown a device of the invention in the form of a narrow band gap bipolar transistor indicated generally by 10. The bipolar transistor 10 incorporates successively disposed layers, the first layer 14 being a subcollector layer 14 which is in contact with a 500 µm thick indium antimonide (lnSb) or GaAs substrate 12. Each subsequent layer 16 to 22 and 26 to 30 is in contact and forms junctions with two respective layers adjacent to it Details of the layers are as follows:

sub-collector layer 14: 1 µm thick layer of n$^+$lnSb with a doping density of $2\times10^{18}$ cm$^{-3}$, collector layer 16: 0.5 µm thick layer of n$^-$lnSb with a doping density of $2\times10^5$ cm$^{-3}$, base layer 18: a 0.12 µm thick layer of p$^+$lnSb with a doping density of $2\times10^{18}$ cm$^{-3}$, emitter layer 26: a 30 nm thick layer of n$^-$ln$_{0.95}$Al$_{0.05}$Sb with a doping density of $4\times10^{17}$ cm$^{-3}$, emitter cap layer 28: a 30 nm thick layer of n$^+$ln$_{0.95}$Al$_{0.05}$Sb with a doping density of $2\times10^-$cm$^{-3}$, emitter contact layer 30: a 0.1 µm thick layer of n$^+$lnSb with a doping density of $2\times10^{18}$ cm$^{-3}$, excluding base layer 20: a 20 nm thick layer of p$^+$ln$_{0.85}$Al$_{0.15}$Sb with a doping density of $5\times10^{18}$ cm$^{-3}$, base cap layer 22: a 0.1 µm thick layer of p$^+$lnSb with a doping density of $5\times10^{18}$ cm$^{-3}$.

The bipolar transistor 10 also incorporates metal base, emitter and collector contacts 24, 32, 34 each consisting of a chromium layer 10 nm thick and a gold layer 200 nm thick.

In combination, the layers 26, 28 and 30 and the emitter contact 32 constitute an emitter mesa 36. The p$^+$ln$_{0.85}$Al$_{0.15}$Sb (**) layer 20, the p$^+$lnSb layer 22 and the metal base contact layer 24 constitute an excluding base contact 25. The emitter mesa 36, the excluding base contact 25 and the metal emitter contact 34 each have a width b of 1 µm and are spaced apart by laterally by distances of 1 µm.

Figure 2:
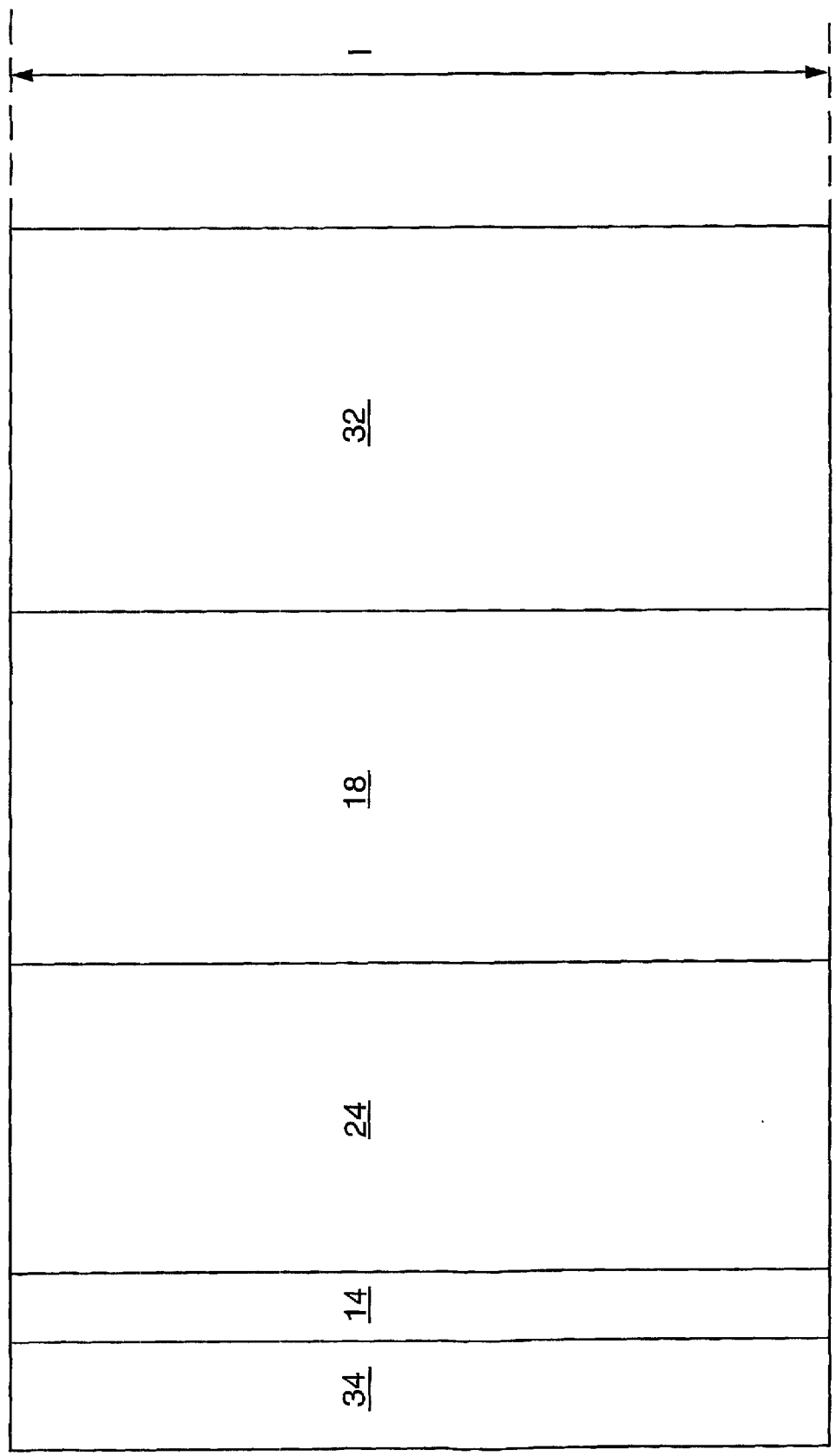
FIG. 2 is a plan view of the FIG. 1 transistor.

Referring to FIG. 2, there is shown a plan view of the bipolar transistor 10, indicating the lateral positions of the metal base, emitter and collector contacts 24, 32, 34. The transistor 10 has a length l of 10 μm.

The transistor 10 is fabricated by standard methods familiar to those skilled in the art of semiconductor device fabrication. Layers 14, 16, 18, 26, 28, 30 and 32 are initially grown over the full surface of the substrate 12 by molecular beam epitaxy (MBE). Layers 26, 28 and 30 are etched down to the base layer 18 to produce part of the emitter mesa 36. The layer 18 is etched down to the subcollector layer 14 so that the base layer 18 and collector layer 16 are upstanding from the sub-collector layer 14. The excluding base layer 20 and the base cap layer 22 are then regrown by MBE. The metal base, emitter and collector contacts 24, 32 and 34 are subsequently deposited by electron beam evaporation or sputtering.

Figure 3:
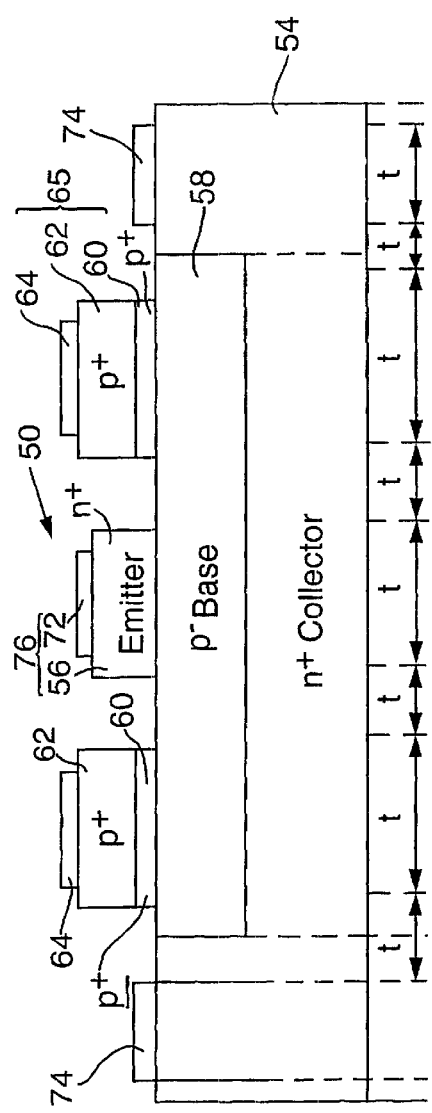
FIG. 3 shows a vertical section through a prior art narrow bandgap bipolar transistor.
Figure 4:
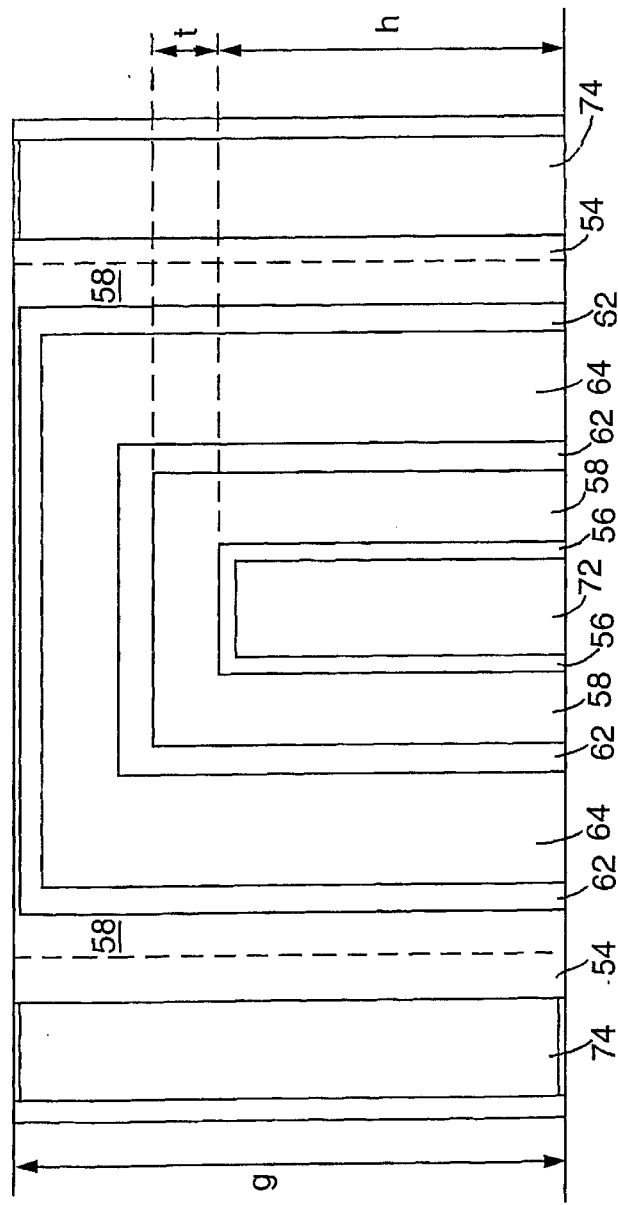
FIG. 4 shows a plan view of the FIG. 3 transistor.

Referring now to FIG. 3, there is shown a vertical cross section of a prior art narrow band gap bipolar transistor indicated generally by 50. A plan view of the transistor 50 is shown in FIG. 4. The transistor 50 comprises successively disposed layers, the first layer 54 being a 1 μm thick $n^+$InSb collector layer which is in contact with an undoped InSb substrate (not shown.) The transistor 50 further comprises a 0.12 μm thick $p^-$InSb base layer 58 and a 0.1 thick $n^+$InSb emitter layer 56. An excluding base contact structure 65 comprising a 20 nm thick $p^+$In$_{0.85}$Al$_{0.15}$Sb (**) layer 60, a $p^+$InSb layer 62 and a metal base contact layer 64 surrounds the emitter 56, as in the transistor 10. The emitter 56 and excluding base contact structure 65 have metal contact layers 72 and 64 respectively. Doping levels are $2 \times 10^{18}$ cm$^{-3}$ in the collector layer 54 and the emitter layer 56, $5 \times 10^{15}$ cm in the base layer 58 and $3 \times 10^{18}$ cm$^{-3}$ in layers 60 and 62. The metal contact layer 72 and the emitter layer 56 together from an emitter mesa 76; The lateral distances t in FIGS. 3 and 4 are all equal to 1 μm. Referring to FIG. 4, the overall length g of the transistor 50 is 10 μm and the length h of the emitter mesa 76 is 6 μm.

Figure 5:
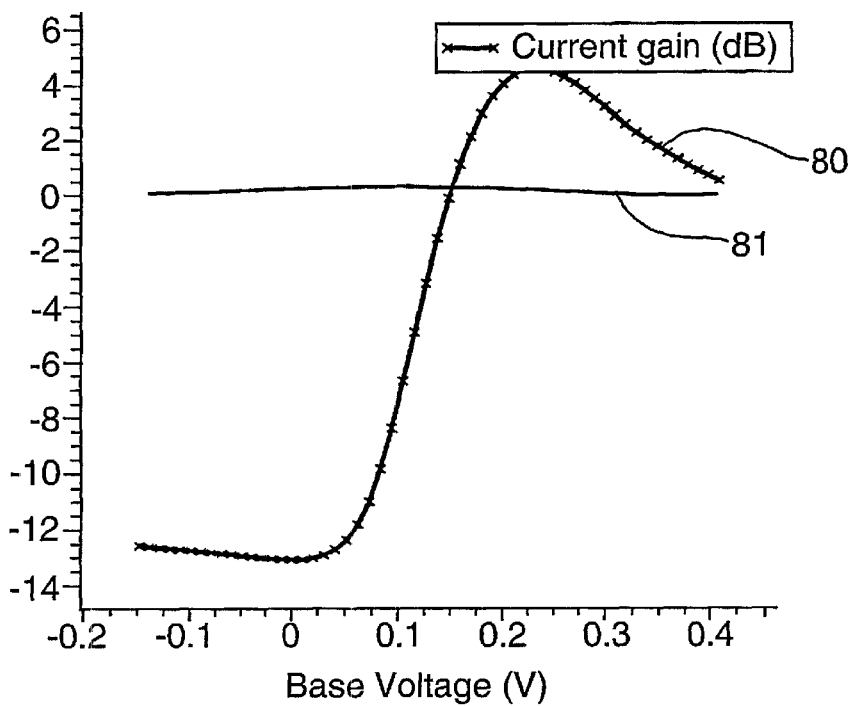
FIGS. 5, 6 and 7 show the current, voltage and power gain of the FIG. 1 and FIG. 3 transistors as a function of base voltage.

Referring to FIG. 5 there are shown graphs 80, 81 of current gain in decibels (dB) versus base voltage in volts for the bipolar transistor 10 and for the transistor 50 respectively at room temperature. The graphs 80 and 81 show that the transistor 10 of the invention has a much greater current gain for base voltages in the range 0.15V to 0.35V (i.e. while the device is on) than the prior art transistor 50.

Figure 6:
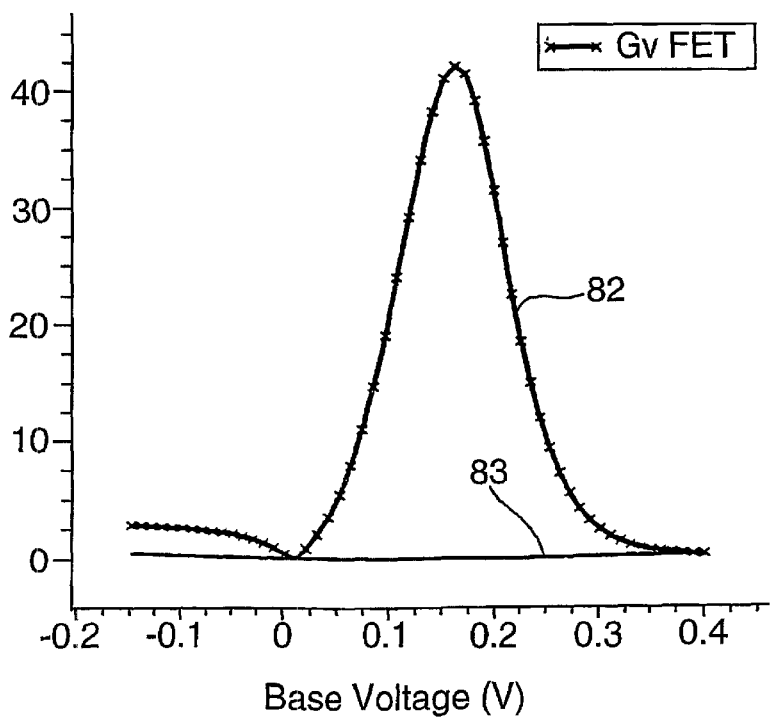

FIG. 6 shows graphs 82, 83 of the voltage gain characteristics of the transistor 10 and the transistor 50 respectively. For base voltages between 0.1V and 0.3V (namely while the device is on), the voltage gain of the transistor 10 is many orders of magnitude greater than that of the prior art transistor 50.

Figure 7:
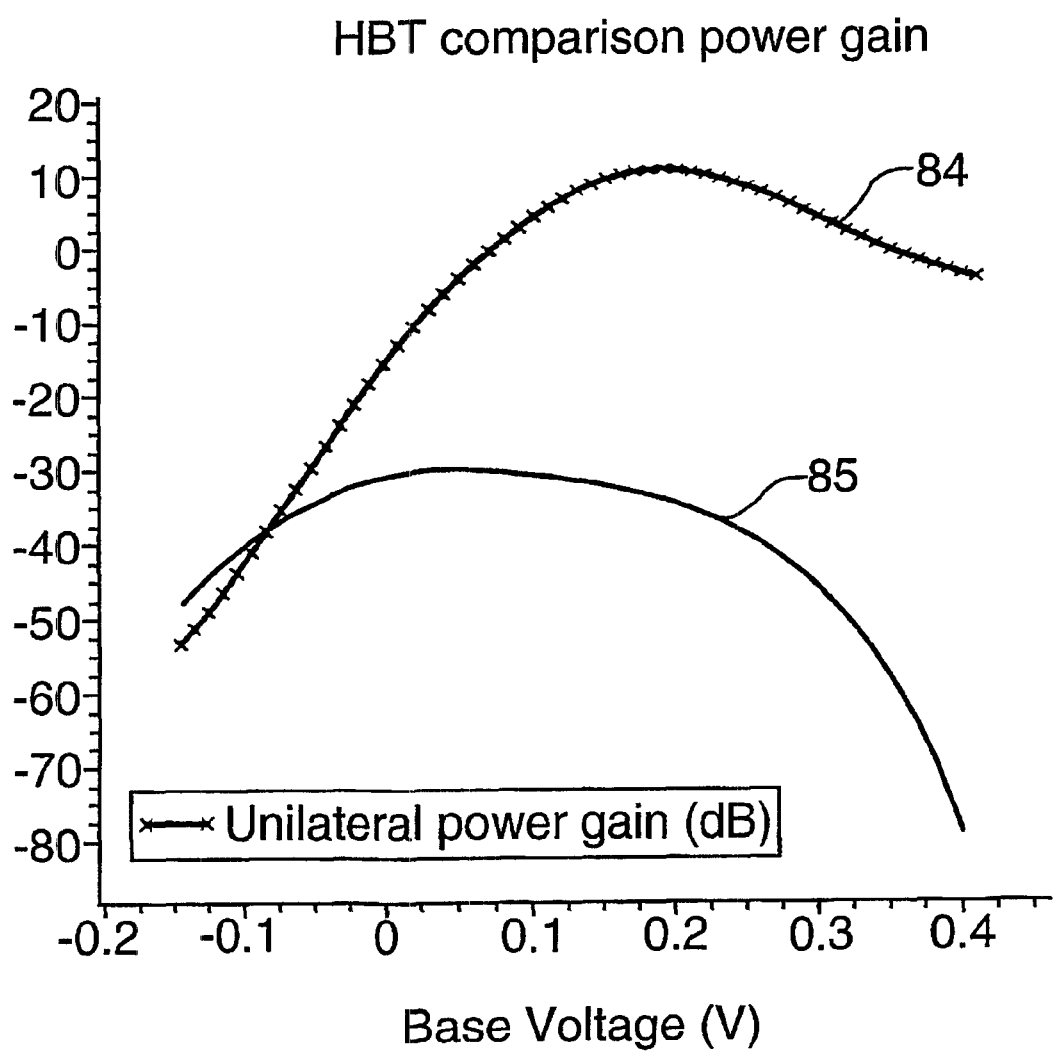

FIG. 7 shows graphs 84, 85 of power gain in decibels (dB) versus base voltage for the transistors 10 and 50 respectively. The transistor 10 has much greater power gain than the transistor 50 for base voltages in the useful range −0.1V to 0.4V.

The emitter layer 26 and emitter cap layer 28 of the transistor 10 have a bandgap which is approximately 50% greater than that of the emitter cap layer 32, the base layer 18, the collector layer 16 and the sub-collector layer 14. Transistors of the invention operate satisfactorily without a difference in bandgap between the layers 26 and 28 and the other layers, although if the base and emitter doping levels are equal, this feature serves to maintain current gain.

Figure 8:
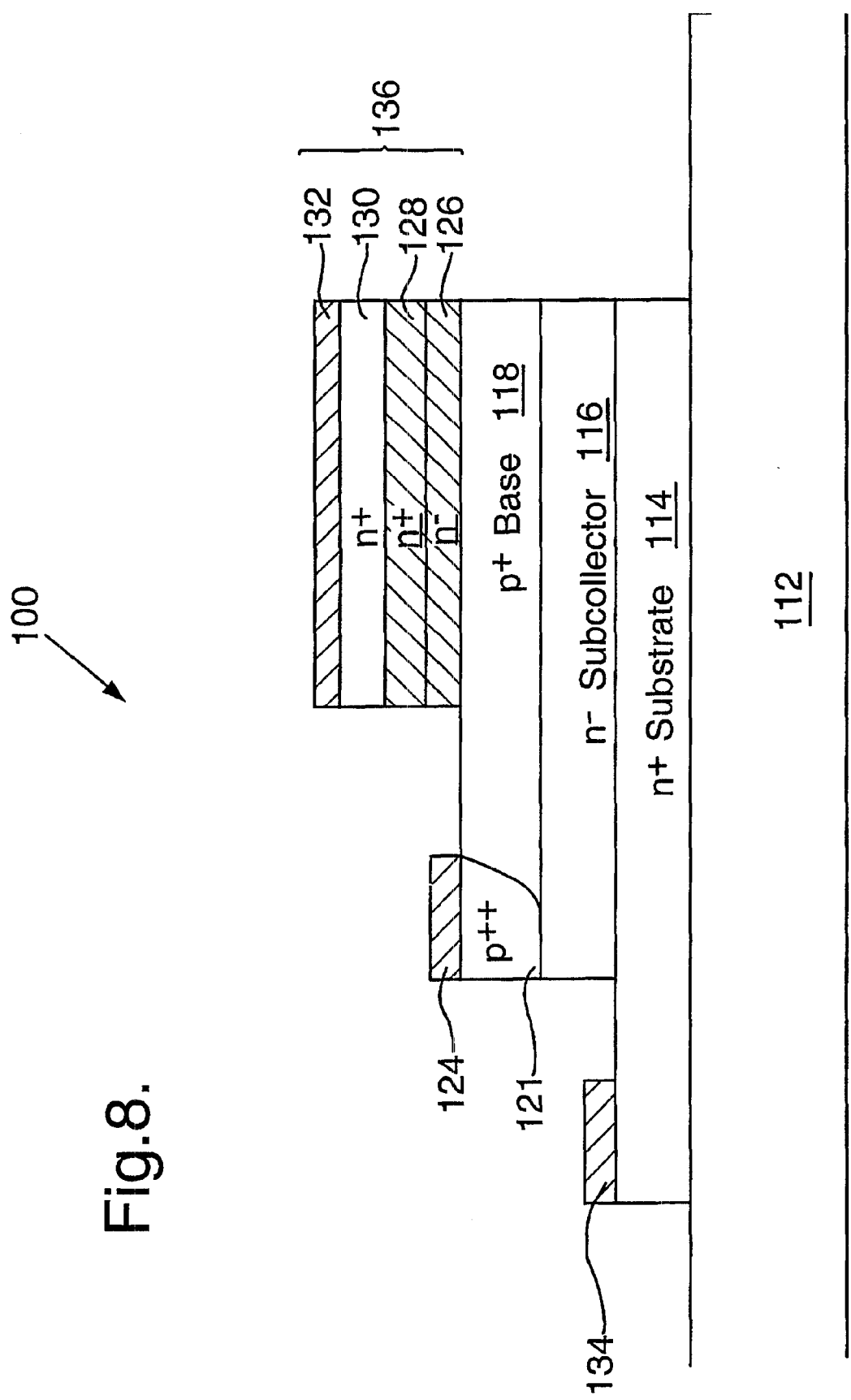
FIGS. 8 and 9 show vertical sections through alternative transistors of the invention.

Referring now to FIG. 8, there is shown an alternative transistor of the invention, indicated generally by 100. Parts equivalent to those of the transistor 10 are similarly referenced with a prefix 100. The transistor 100 has a structure and dimensions identical to those of the transistor 10, except that the transistor 100 has an excluding $p^{++}$ implant 121 within the base layer 118 instead of an excluding heterostructure. The transistor 100 is simpler to fabricate than the transistor 10 as there is no requirement to regrow an excluding heterostructure after the emitter mesa has been defined by etching. The $p^{++}$ implant 121 is produced by implanting with magnesium at an energy of approximately 25 keV with a suitable dose of $5 \times 10^{13}$ cm$^{-2}$, to provide a doping level near the surface of over $10^{19}$ cm$^{-3}$.

Figure 9:
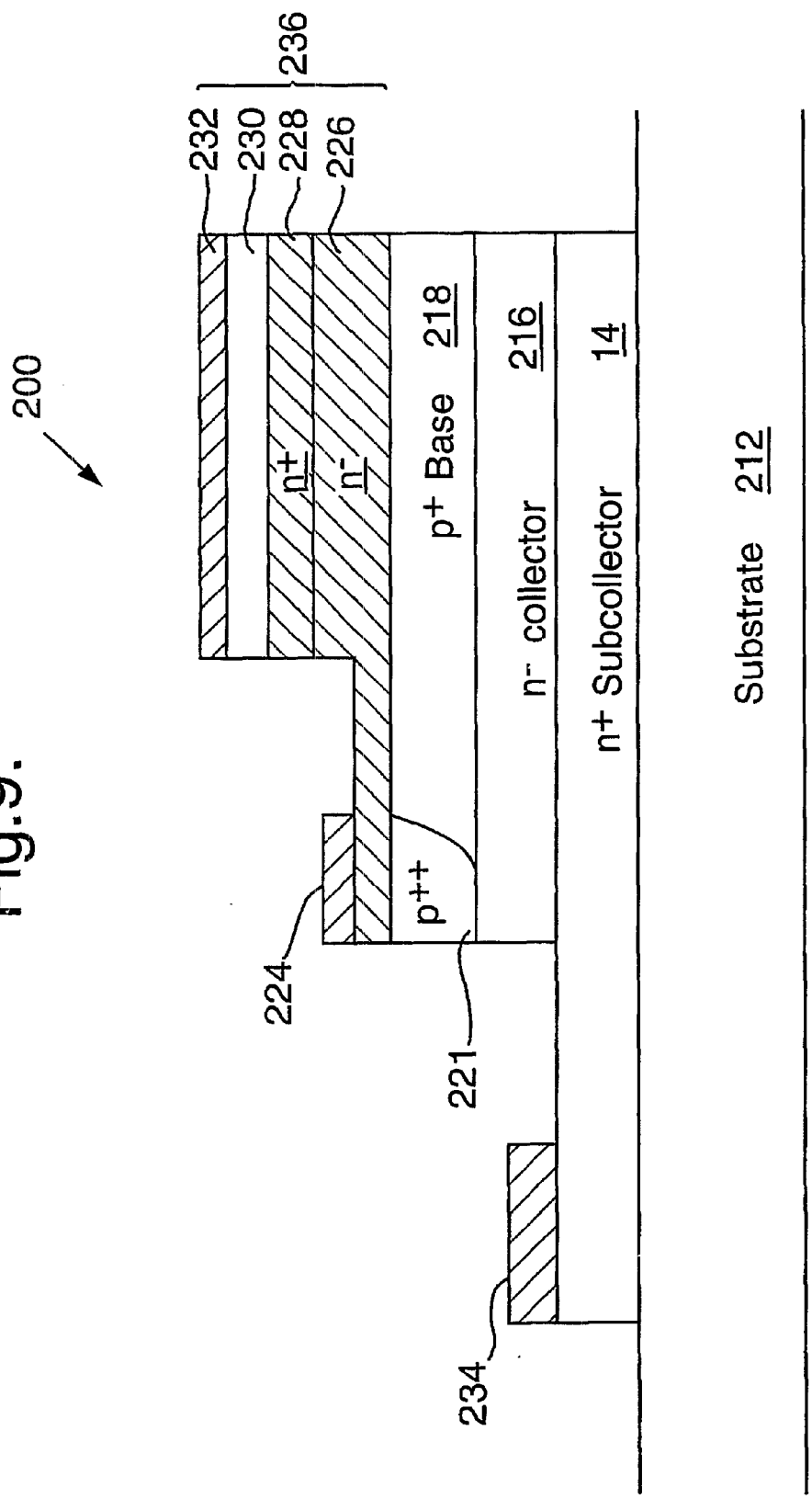

Referring to FIG. 9, there is shown a further transistor of the invention indicated by 200. Parts equivalent to those of the transistor 100 are similarly referenced with a prefix 200. The transistor 200 has dimensions and structure identical to that of the transistor 100, except that layer 226 is not etched away when forming the emitter mesa. The layer 226 therefore acts as a passivation layer (due to its wider bandgap), reducing recombination at the base surface and improves transistor performance by increasing current gain and reducing leakage. The layer 226 is type converted to p-type by the much higher doping introduced by the base implant, and so is incorporated into the base contact, where it also serves to improve the excluding properties of the contact It therefore serves a multiple function of benefit to the performance of the transistor.

What is claimed is:

1. A bipolar transistor having emitter and collector regions arranged to extract minority carriers from the base region, a structure for counteracting entry of minority carriers into the base region via the base contact, the base region having a band gap less than 0.5 eV and wherein the base region has a doping level greater than $10^{17}$ cm$^{-3}$.

2. A bipolar transistor according to claim 1 wherein the base region has a doping level greater than that of the emitter region, and where the emitter region has a wider bandgap than that of the base region.

3. A bipolar transistor according to claim 1 wherein the structure for preventing entry of minority carriers into the base via the base contact is an excluding heterostructure.

4. A bipolar transistor according to claim 1 wherein the structure for counteracting entry of minority carriers into the base via the base contact is an implanted region within the base region, making the doping level of the base contact higher than that of the base itself.

5. A bipolar transistor according to claim 4 wherein the transistor includes an integral passivation layer between the base and emitter regions, using the wide gap emitter region externally to the emitter, and having its doping type converted to that of the base using the base contact implant.

* * * * *